United States Patent
Dumoulin

(10) Patent No.: US 12,142,421 B2
(45) Date of Patent: Nov. 12, 2024

(54) APPARATUS AND SYSTEM TO ENHANCE THERMAL GRADIENTS IN CRYOGENIC DEVICES

(71) Applicant: CHILDREN'S HOSPITAL MEDICAL CENTER, Cincinnati, OH (US)

(72) Inventor: Charles Lucian Dumoulin, Cincinnati, OH (US)

(73) Assignee: CHILDREN'S HOSPITAL MEDICAL CENTER, Cincinnati, OH (US)

(*) Notice: Subject to any disclaimer, the term of this patent is extended or adjusted under 35 U.S.C. 154(b) by 261 days.

(21) Appl. No.: 17/466,064

(22) Filed: Sep. 3, 2021

(65) Prior Publication Data

US 2022/0068529 A1     Mar. 3, 2022

Related U.S. Application Data

(60) Provisional application No. 63/073,988, filed on Sep. 3, 2020.

(51) Int. Cl.
*H01F 6/04*     (2006.01)
*G01R 33/3815*  (2006.01)

(52) U.S. Cl.
CPC .......... *H01F 6/04* (2013.01); *G01R 33/3815* (2013.01)

(58) Field of Classification Search
CPC ............................. G01R 33/3815; H01F 6/04
See application file for complete search history.

(56) References Cited

U.S. PATENT DOCUMENTS

| | | | |
|---|---|---|---|
| 5,410,286 A | 4/1995 | Herd et al. | |
| 6,107,905 A | 8/2000 | Itoh et al. | |
| 8,633,692 B2 | 1/2014 | Strobel et al. | |
| 2010/0248968 A1* | 9/2010 | Stautner | G01R 33/3804 29/599 |
| 2015/0369885 A1* | 12/2015 | Ito | G01R 33/3815 324/309 |
| 2016/0329138 A1* | 11/2016 | Morita | H01F 1/10 |
| 2020/0340626 A1 | 10/2020 | Chorley et al. | |

* cited by examiner

*Primary Examiner* — Nael N Babaa
(74) *Attorney, Agent, or Firm* — BakerHostetler

(57) ABSTRACT

Apparatus and methods to create and/or enhance thermal gradients in a body of cryogenic liquid contained in a vessel that is actively cooled by a cryocooler is provided. With such apparatus and/or methods temperature in one part of the body of liquid can be made lower than the temperature in another part of the body of liquid. Thus, the apparatus and/or methods enables cryogenic operation of a device at a temperature that is below that of the boiling point of the cryogenic liquid while simultaneously allowing the liquid to be at a pressure greater than atmospheric pressure to obviate the risk of air entering the cryogenic space. These apparatus and/or methods may find use in cryogenic systems used for magnetic resonance imaging, cyclotrons for radioisotope generation, cyclotrons for radiation therapy, high-energy particle accelerators, magnet systems for crystal growth and the like.

39 Claims, 14 Drawing Sheets

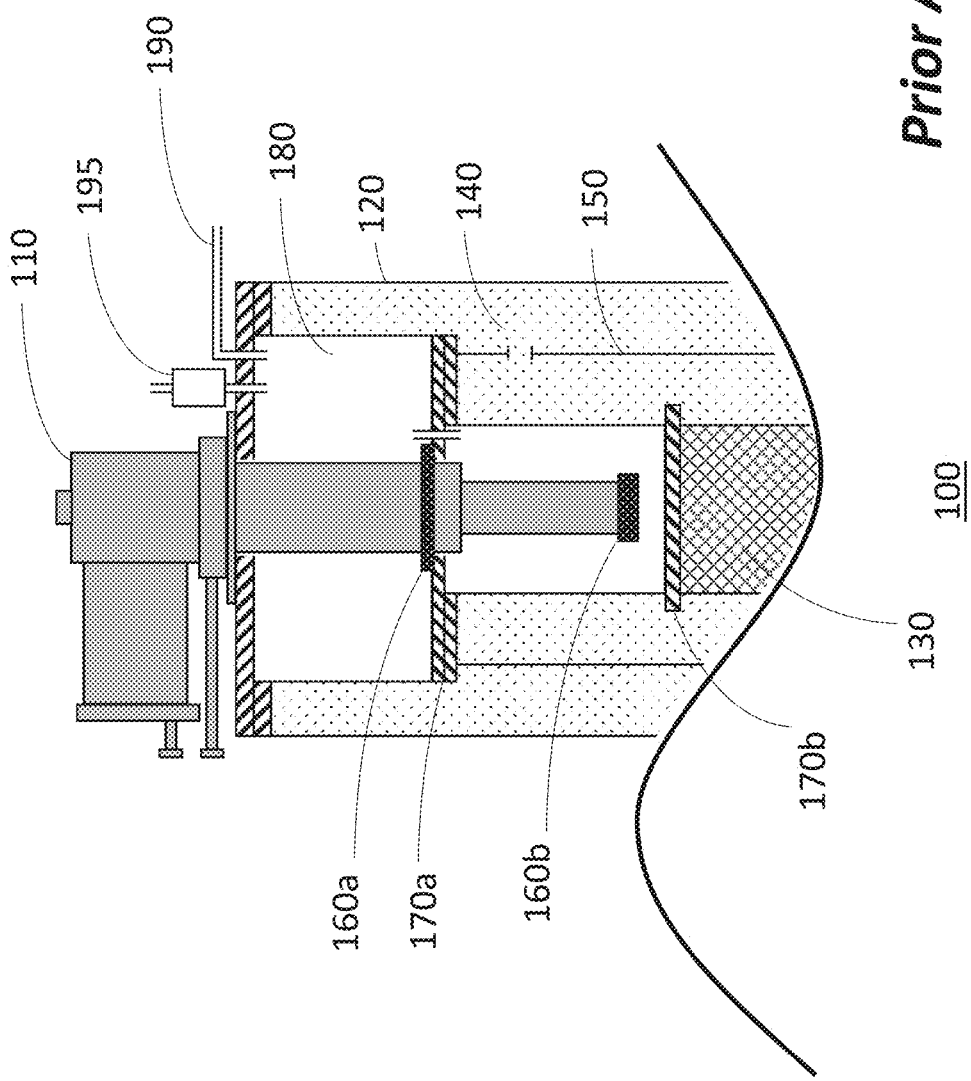

APPARATUS AND SYSTEM TO ENHANCE THERMAL GRADIENTS IN CRYOGENIC DEVICES

CROSS-REFERENCE TO RELATED APPLICATIONS

The current application claims priority to U.S. Provisional Application No. 63/073,988, filed Sep. 3, 2020; the disclosure of which is incorporated herein by reference in its entirety.

BACKGROUND

Devices operating at temperatures close to absolute zero are used in a number of important applications including Magnetic Resonance Imaging (MRI), cyclotrons for the production of radioactive isotopes, cyclotrons for the production of therapeutic proton beams, particle accelerators used for high-energy research, magnets for improving the purity of crystals during crystal growth, and the like. Many of these applications seek to lower the temperature of superconducting wire to put the wire into a superconductive state so that the wire can support electrical current without resistance. In many of these applications the use of cryogenic temperatures is the only available technical recourse to meet the need. For example, the creation of a sufficiently stable and uniform 1.5 Tesla or 3.0 Tesla magnetic field over the dimensions of a human body used in MRI has only been achieved to date with superconducting magnets operating at cryogenic temperatures.

A variety of superconducting wire formulations and designs are known to those skilled in the art. In general, superconducting wire falls into one of two categories: Low Temperature Superconductors (LTS) and High Temperature Superconductors (HTS). Wires constructed with Niobium Tin (NbSn) or Niobium Titanium (NiTi) are LTS wires, while formulations such as Magnesium di-Boride ($MgB_2$) are considered to be HTS. In general, LTS wires operate at temperatures close to absolute zero, and often are cooled with liquid helium held at atmospheric pressure and boiling at 4.2 degrees Kelvin. Many HTS formulations can operate at liquid nitrogen temperatures (i.e. 77 degrees Kelvin), but because of their mechanical properties and expense, HTS wires are not as widely used as LTS wires. For the purpose of this disclosure, "cryogenics" and "cryogenic temperatures" means temperatures approximately equal to the boiling point of liquid helium, and indeed embodiments of the current disclosure are directed towards devices employing liquid helium. It should be noted, however, that the principles and spirit of the invention are applicable to HTS devices operating with liquid nitrogen or other low temperature liquids.

An important aspect of superconducting wire is that it exists in one of two states, and there is a discrete transition between these states. At room temperature LTS wire has a non-zero resistance and behaves like ordinary conductive wire. This state is called the "normal" state. When certain conditions are met, however, the LTS wire enters the "superconducting" state in which it has zero resistance. Three independent parameters govern the transition between normal and superconducting states. These are: the wire's current density, J, the magnetic field, B, and the temperature of the wire, T. The precise values of these parameters at the transition between normal and superconducting states depends on the formulation and construction of the superconducting wire. Furthermore, there is an interdependency between these parameters. For example, if the magnetic field and current density in the wire are low, the transition temperature at which the wire becomes superconducting is relatively high, but as the field and/or current density are increased, the critical temperature decreases. Consequently, there is an operational envelope defined by current density, magnetic field, and temperature that defines the transition between the normal and superconducting states. It should be noted that the operating parameters within an LTS device may vary as a function of location within the device, and thus certain portions of the device may operate closer to the superconducting transition envelope than others.

For the purpose of illustration it is useful to consider a magnet constructed with LTS wire. The magnet can be assembled at room temperature and consists of one or more coils of LTS wire, each coil having a selected number of turns. The coils are connected to each other in serial fashion and the first coil is connected to the last to create a complete circuit. The magnet is designed so that when electrical current passes through the winding, a magnetic field is created inside the coils. Immediately after assembly, the current in the wire is zero and the wire is at room temperature. Consequently, the LTS wire is in the normal state. Current can be introduced into the winding to create a magnetic field, but it must be maintained by an external power supply. Furthermore, because the wire has a non-zero electrical resistance, the current causes the wire to heat up.

To operate the magnet below the superconducting transition envelope, the LTS wire must be cooled to cryogenic temperatures. This can be accomplished by placing the windings in a suitably designed cryostat and lowering the temperature of the windings using cryogenic liquids and/or a cryocooler system. At some point in the cool down, the temperature of the LTS wire in the magnet windings becomes lower than the critical temperature of the wire, and the wire enters the superconducting state. Now, when electrical current is introduced to the wire, the current flows without resistance and no heat is generated in the windings. As the current is increased the magnetic field created by the windings also increases. However, as more and more current is added, the operational point of the LTS wire becomes closer to the superconducting transition envelope. In general the design parameters of the magnet are chosen so that the desired magnetic field can be achieved without crossing this envelope.

If the operating conditions of the magnet exceed the superconducting transition envelope anywhere within the LTS wire, then that segment of wire will enter the normal state. The segment of LTS wire in the normal state develops non-zero resistance and thus, the current in the wire generates heat. This heat will warm the surroundings of the wire and force more wire into the normal state. This process, called quenching, rapidly converts all of the energy contained in the electrical current flowing through the windings into heat, and causes a collapse of the magnetic field. It is worth noting that most quenches in superconducting magnets are caused by elevated temperatures since the magnetic field and the electrical current in the wire are typically well-understood and controlled. Increased temperatures can be caused by failures in the cryogenic system of the apparatus or by the release of mechanical energy when a portion of the apparatus yields suddenly to the forces within the system. This latter scenario accounts for "training quenches" that can occur during the commissioning of a superconducting magnet.

In practice, it is often desirable to operate an LTS system as far below the superconducting transition envelope as possible to provide the greatest margin for error. The focus of this disclosure is to provide means to lower the operational temperature of a cryogenic system, and while it has application to LTS systems, the field of the invention encompasses cryogenic systems in general.

Liquid helium is commonly used for cryogenic systems and has a number of unique properties that make it useful. At atmospheric pressure, liquid helium boils at 4.2 degrees Kelvin. At this temperature all other materials are solid. Furthermore, at this temperature substantially all other materials have diminished heat capacity and diminished thermal conductivity. Liquid helium, however, retains it fluidity and indeed becomes super-fluid at approximately 2.18 degrees Kelvin. At cryogenic temperatures helium also has a high heat capacity and high thermal conductivity with respect to other materials.

Cryogenic systems that operate at 4.2 degrees Kelvin are relatively straightforward to those skilled in the art. The general approach to designing such a system is the creation of a well-insulated cryostat that minimizes the ingress of external heat and allows liquid helium to be collected and maintained at atmospheric pressure. Since all other materials are solid at this temperature the only option for the gas above the liquid helium is gaseous helium. In many devices the liquid helium is generated outside of the device and transferred into the cryostat via an insulated line. The helium is then allowed to slowly evaporate and maintains the device at 4.2 degrees Kelvin until the helium is fully consumed. In many superconducting MM systems, the magnet windings are submerged in as much as 2000 liters of liquid helium. To reduce cost and save on the consumption of helium, these systems typically employ a cryocooler located at the top of the cryostat to condense gaseous helium and return it to the helium bath. These cryocoolers typically have a Gifford-McMahon (GM), or pulse tube design, but other configurations are possible. In order to condense gaseous helium at atmospheric pressure the cryocooler needs to operate at temperatures below 4.2 degrees Kelvin. In general, the cooling power of the cryocooler is selected to be greater than the heat that enters the cryostat. This allows the magnet to continue to operate over a range of cryocooler efficiency, but creates an operational challenge since the liquefaction of helium gas will cause the pressure of the gas above the liquid helium to become sub-atmospheric. Although sub-atmospheric helium baths can be useful for attaining temperatures below 4.2 degrees Kelvin, operating the system at sub-atmospheric pressure is dangerous since any leaks in the system will allow air to be sucked into the cold space where it will solidify. Solid air can block the exit route for helium gas in the event of a quench, and places the magnet cryostat at risk of rupturing during a quench. Consequently, most superconducting magnets are equipped with a small electric heater that heats the helium to keep the helium gas pressure above atmospheric pressure. The heater is controlled by a pressure sensor, and the diminishment of heater current over time is frequently used as a service indicator of a failing cold head.

The existence of a helium bath adds complexity to the device's design and adds operational risk. An alternate design approach is to place a cryocooler in direct or indirect contact with the cold mass of the device and to provide thermal conduction paths to remove heat from the cold mass via the cold head. This approach is known as conduction cooling to those skilled in the art. Conduction cooling eliminates the need for a liquid helium bath, but can present its own challenges. For example, vibrations produced by a directly-coupled cold head may be propagated into the cold mass and have undesired detrimental effects on the device. For example, cold head-induced vibrations are known to cause magnetic field instability in superconducting magnets using direct cryocooler connection to the cold mass. Consequently, it may be desirable to have a liquid helium thermal link between the cold head and the cold mass to minimize the coupling of cryocooler vibrations with the cold mass. Another challenge of conduction cooled designs is that the space around the cold head needs to be kept clear of air. This can be accomplished by enclosing the space and allowing the cryocooler to solidify all of the gas in the volume and create a vacuum. This is a phenomenon known in the art as cryopumping. Alternatively, the space around the cold head can be put under vacuum before the cooling commences to prevent the freezing of surrounding gas. Another approach is to fill the space around the cold head with helium gas. As the gas is cooled and starts to liquefy, however, the space around the cold head will lose pressure. If the pressure is below atmospheric pressure, then the temperature of the boiling helium can be below 4.2 degrees Kelvin. If desired, more gaseous helium can be added until an equilibrium between the liquid and gaseous helium is reached. If the pressure of the helium is held at atmospheric pressure, the liquid helium around the cold head will boil at 4.2 degrees Kelvin and it becomes difficult to get the cold mass much colder. Temperatures lower than 4.2 degrees Kelvin may be possible when the pressure is sub-atmospheric, but under this condition the risk of air ingress and the commensurate generation of frozen air is elevated. Consequently, it can be seen that simultaneously maintaining liquid helium at temperatures below 4.2 degrees Kelvin while the gas above the liquid helium is at atmospheric pressure is difficult.

SUMMARY

In general, there may be benefit to operating a helium bath or a directly coupled cryogenic system at a temperature below 4.2 degrees Kelvin while maintaining helium gas in the cryogenic space at atmospheric pressure or slightly above atmospheric pressure. In the case of superconducting wire, having a temperature below 4.2 degrees Kelvin provides an enhanced margin of operation under the superconducting transition envelope. This benefit can manifest itself as a longer period of time that a magnetic field can be maintained if the cold head is turned off, or higher operational currents (and hence higher magnetic fields). The benefit of having helium gas that is slightly above atmospheric pressure is that if the device has a small leak, helium gas will escape and air will not be entrained in the system where it will solidify and create undesired apparatus behavior and/or present a safety risk.

Thus, embodiments of the current disclosure provide an apparatus and/or system that permits a cryocooler to cool a cold mass to temperatures below 4.2 degrees Kelvin while simultaneously maintaining a positive pressure relative to the surrounding atmosphere.

Embodiments of the current disclosure provide an apparatus or system to create and/or enhance thermal gradients in a body of cryogenic liquid contained in a vessel so that the temperature in one part of the body of liquid is lower than the temperature in another part of the body of liquid. Thus, the invention enables cryogenic operation of a device at a temperature that is below that of the boiling point of the cryogenic liquid while maintaining a positive pressure in the device. This invention may find use in cryogenic systems used for magnetic resonance imaging, cyclotrons for radioisotope generation, cyclotrons for radiation therapy, high-energy particle accelerators, magnet systems for crystal growth and the like.

In the absence of the current disclosure, cryogenic liquid in a closed vessel having a selected pressure will boil at a given temperature to maintain equilibrium of mass transfer between the liquid and gaseous phases. Boiling liquid undergoes constant mixing, and thus heat is efficiently transferred across the vessel and the entire body of liquid is substantially at the same temperature. Even in the absence of boiling, small thermal gradients in the liquid can cause heat transfer via convection, and heat can also be conducted by diffusion processes. Thus, in a conventional vessel, the boiling cryogenic liquid will have a relatively uniform temperature due to multiple mechanisms, and this temperature will be related to pressure.

In the current disclosure a structure of a selected shape and material is added into the cryogenic vessel containing the cryogenic liquid to reduce mass transfer due to boiling and convection, and to reduce heat transfer due to diffusion. The thermal gradient enhancement structure is preferably made from a thermally insulating material having lower heat capacity and heat conductivity than the cryogenic liquid. The geometric shape of the structure is selected to lengthen the path between different zones within the vessel to allow thermal gradients in the cryogenic liquid to be established. Embodiments of the current disclosure can be used in liquid helium cryogenic systems to permit the operation of the system while the vessel is at atmospheric, or above-atmospheric, pressure while allowing a portion of the liquid helium to exist at temperatures below the boiling point of helium.

In one embodiment of the invention, features that permit the rapid conversion of the cryogenic liquid into gas without substantially obstructing the movement of the gas are incorporated into the thermal gradient enhancing structure. Such features may be useful for cryogenic systems used to cool superconducting magnets with the potential to experience quenching. During a quench event, the energy contained in the electrical current of the magnet is converted to heat and the temperature of the cold mass can rapidly exceed the cooling capacity of a cold head and cause the temperature of the cryogenic liquid to rise above its boiling point. This causes the cryogenic liquid to flash boil and quickly creates a substantial amount of gas. Features of the current disclosure that permit flash boiling to occur without causing back pressure within the thermal gradient enhancement structure can include long open channels, one way valves, flaps, flexible walls, or the like.

In another embodiment of the invention, the thermal gradient enhancement structure is used with a constant gas pressure system to allow the pressure of the gas above the cryogenic liquid to be maintained at a desired pressure. This pressure maintenance system can be comprised of a gas source, pressure regulator, and pressure relief valve connected with suitable plumbing to the cryogenic vessel. If desired the system can also include a pump, gas buffer and/or sensors and actuators. Maintenance of pressure slightly above atmospheric pressure is particularly useful for preventing ingress of air into the cryogenic space.

The current disclosure will now be described in more detail with reference to exemplary embodiments thereof as shown in the accompanying drawings. While the current disclosure is described below with reference to exemplary embodiments, it should be understood that the current disclosure is not limited thereto. Those of ordinary skill in the art having access to the teachings herein will recognize additional implementations, modifications, and embodiments, as well as other fields of use, which are within the scope of the current disclosure as described herein, and with respect to which the current disclosure may be of significant utility.

BRIEF DESCRIPTION OF THE DRAWINGS

FIG. 1 is a diagram representation of a cold head used to create cryogenic temperatures in a cold mass using a configuration well known to those skilled in the art;

FIG. 6b is an elevational cross-section view of the embodiment of FIG. 6a;

FIG. 7b is an elevational cross-section view of the embodiment of FIG. 7a;

FIG. 8b is an elevational cross-section view of the embodiment of FIG. 8a;

FIG. 9b is an elevational cross-section view of the embodiment of FIG. 9a;

FIG. 10a is a perspective view representation of a fifth embodiment of the thermal gradient enhancement structure employing a serpentine channel for the cryogenic liquid;

FIG. 10b is an elevational cross-section view of the embodiment of FIG. 10a;

FIG. 11a is a perspective view representation of a sixth embodiment of the thermal gradient enhancement structure employing a helical channel for the cryogenic liquid;

FIG. 11b is an elevational cross-section view of the embodiment of FIG. 11a;

FIG. 12b is an elevational cross-section view of the embodiment of FIG. 12a;

FIG. 13a is a perspective view representation of an eighth embodiment of the thermal gradient enhancement structure employing a plurality of vanes with movable flaps that move in the event that the cryogenic liquid flashes into a gas; and FIG. 13b is an elevational cross-section view of the embodiment of FIG. 13a.

DETAILED DESCRIPTION

Figure 2A:
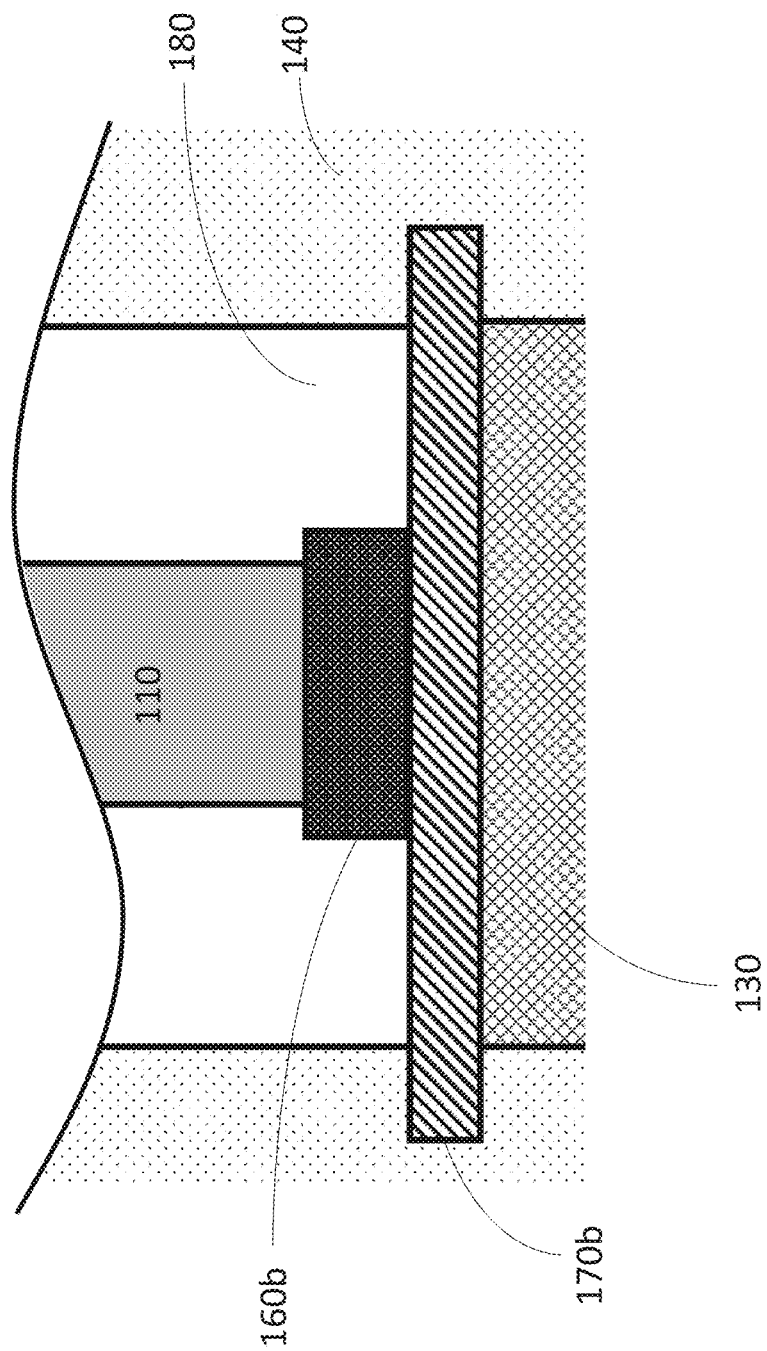
FIG. 2a is a close up representation of one variation of the cold head configuration shown in FIG. 1.

Cooling a device to temperatures within a few degrees of absolute zero is a key requirement in many applications. For example, devices employing Low Temperature Superconducting (LTS) wire for the creation of magnetic fields need to operate at temperatures below the superconducting transition temperature of the LTS wire. Superconducting magnets are essential components of many magnetic resonance imaging systems, cyclotrons, particle accelerators, and laboratory test fixtures. Commonly, these systems employ a bath of liquid helium that is held at atmospheric, or slightly higher than atmospheric, pressure. Helium bath systems operating at near-atmospheric pressure keep the liquid helium in a boiling condition and thus, the cryogenic portion of the device operates at 4.2 degrees Kelvin, even if a cold head used to cool the system is capable of lower temperatures. In general, there is a desire to operate a cryogenic device with as low a temperature as possible, and temperatures below 4.2 degrees Kelvin can be advantageous. It is possible to operate a helium bath at temperatures below 4.2 degrees Kelvin if the gas above the bath is held at sub-atmospheric pressure. Operating at sub-atmospheric pressure, however, presents operational challenges and risks. Consequently, there is a need for an apparatus and/or method to permit liquid helium temperatures lower than 4.2 degrees Kelvin while maintaining positive pressure relative to the atmosphere.

FIG. 1 shows an exemplary cryogenic system 100 in which a cold head 110 is used to remove heat from a generic cryogenic device which is comprised of a cryostat 120 that provides thermal insulation to minimize the ingress of heat to a cold mass 130 contained within the cryostat. To minimize the transfer of heat to the cold mass a vacuum 140 is established inside cryostat 120 and a radiation shield 150 is disposed between the outer wall of cryostat 120 and cold mass 130. Cold head 110 can have a Gifford-McMahon (GM), or pulse tube design, but other configurations are possible. In the exemplary system shown in FIG. 1 cold head 110 is comprised of a first stage 160a and a second stage 160b. First stage 160a is interfaced to a radiation shield thermal link 170a and second stage 160b is interfaced to a cold mass thermal link 170b. Radiation shield thermal link 170a is connected to radiation shield 150 in such a way as to facilitate heat transfer from radiation shield 150. Likewise, cold mass thermal link 170b is connected to cold mass 130 in such a way as to facilitate heat transfer from cold mass 130. Configurations employing additional radiation shields, radiation shields covered in reflective material, and cold mass suspension systems designed to minimize heat transfer are well-known to those skilled in the art.

Cold head 110 is disposed in the cryostat in a cold head chamber 180. Cold head chamber 180 is connected via plumbing to an evacuation/fill port 190 and a pressure relief valve 195. In some exemplary systems cold head chamber 180 can communicate with vacuum 140, but in general, cold head chamber 180 is designed to not communicate with vacuum 140 to permit cold head 110 to be changed without requiring vacuum 140 to be lost. If desired, cold head chamber 180 can be operated with a vacuum, or with helium gas at a selected pressure above, below, or equal to atmospheric pressure. In general, the use of other gasses is inadvisable since at liquid helium temperature all gasses other than helium become solid.

FIG. 2a shows one way in which cold head 110 can be operated. In this approach second stage 160b is placed in direct contact with cold mass thermal link 170b. When operating, second stage 160b becomes the coldest element in the system and in practice temperatures below 3.5 degrees Kelvin are possible. Because second stage 160b is the coldest element in the system, heat moves from cold mass 130 through cold mass thermal link 170b. In general a thermal equilibrium is established in which the amount of heat that reaches cold mass 130 via radiation and conduction is removed by cold head 110. If cold head chamber 180 is operated with a vacuum and if cold head 110 has sufficient cooling power and a low enough second stage temperature, it is possible to lower the temperature of cold mass 130 to a temperature below 4.2 degrees Kelvin. While the configuration shown in FIG. 2a may be suitable for some applications, it is possible for vibrations from cold head 110 to be propagated to cold mass 130 with undesired consequences. Furthermore, if cold head chamber 180 is operated at a pressure below atmospheric pressure, there is a risk of air ingress into the chamber.

Figure 2B:
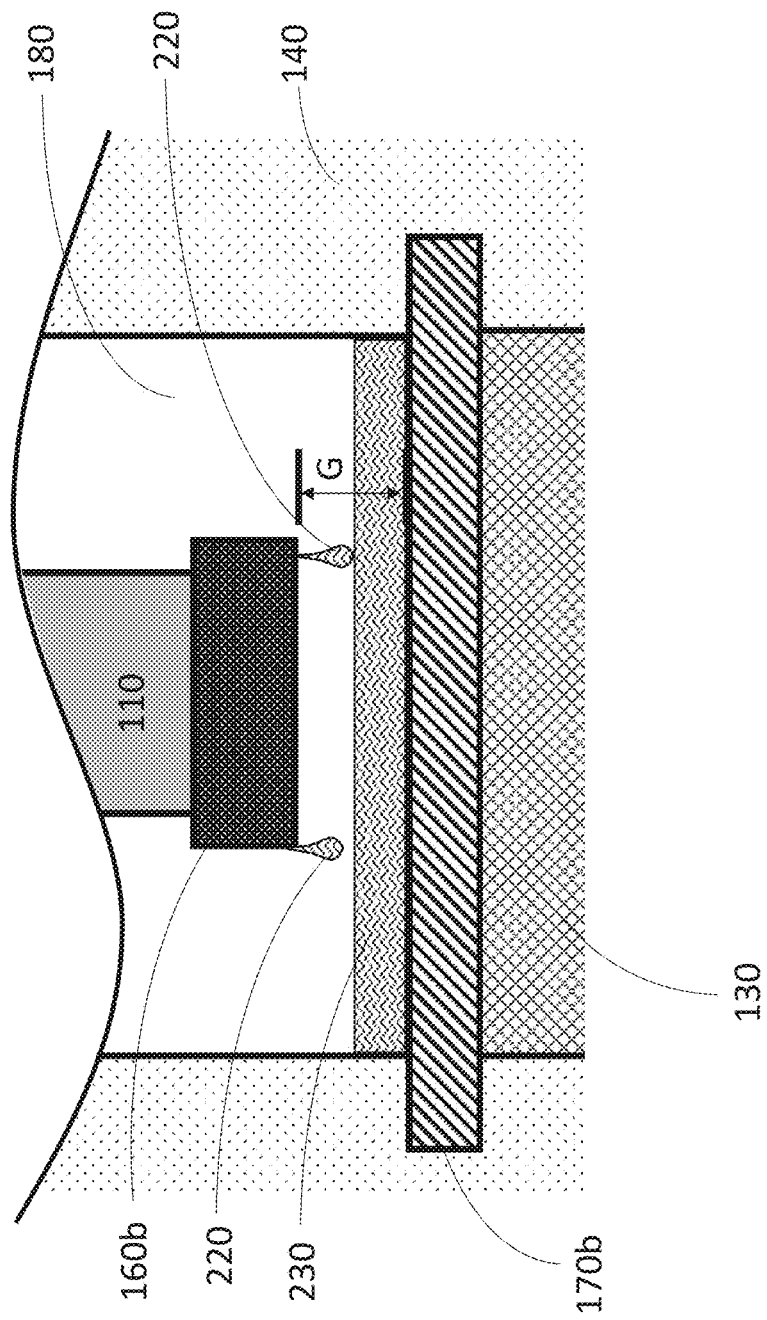
FIG. 2b is a close up representation of a second variation of the cold head configuration shown in FIG. 1.

FIG. 2B shows an alternate way in which cold head 110 can be operated. In this approach second stage 160b is not placed in direct contact with cold mass thermal link 170b. Rather, a gap G exists between second stage 160b and cold mass thermal link 170b. In general, cold head chamber 180 is not placed under vacuum since a vacuum would prevent heat transfer from cold mass thermal link 170b to cold head 110. Rather, a selected amount of helium gas is introduced into cold head chamber 180. With the configuration shown in FIG. 2b, second stage 160b is the coldest element in the system and in practice operates at a temperature sufficiently low enough to condense liquid helium. Liquid helium drops 220 falls off of second stage 160b and collect at the bottom of cold head chamber 180 to form a liquid helium pool 230. When the system is at thermal equilibrium, liquid helium pool 230 boils at the temperature determined by the vapor pressure of the helium gas within cold head chamber 180. With this approach, heat moves from cold mass 130 through cold mass thermal link 170 and then to second stage 160b via mass transport as helium circulates between the liquid and gaseous state. Because the configuration shown in FIG. 2b does not place cold head 110 in direct contact with cold mass thermal link 170b, vibrations from cold head 110 are not easily propagated into cold mass 130. If desired, vibrations can be further minimized by supporting cold mass 110 independently of the cryostat and constructing the walls of cold head chamber 180 with a degree of flexibility. It is important to note, however, that if the helium gas in cold head chamber 180 is maintained at a pressure substantially near one atmosphere, helium pool 230 will boil with a substantially uniform temperature of 4.2 degrees Kelvin. Thus, the presence of helium held at one atmosphere in cold head chamber 180 can be useful for the minimization of vibration and the prevention of air ingress, but its presence makes it difficult to maintain the temperature of cold mass 130 at a temperature below 4.2 degrees Kelvin.

Figure 3:
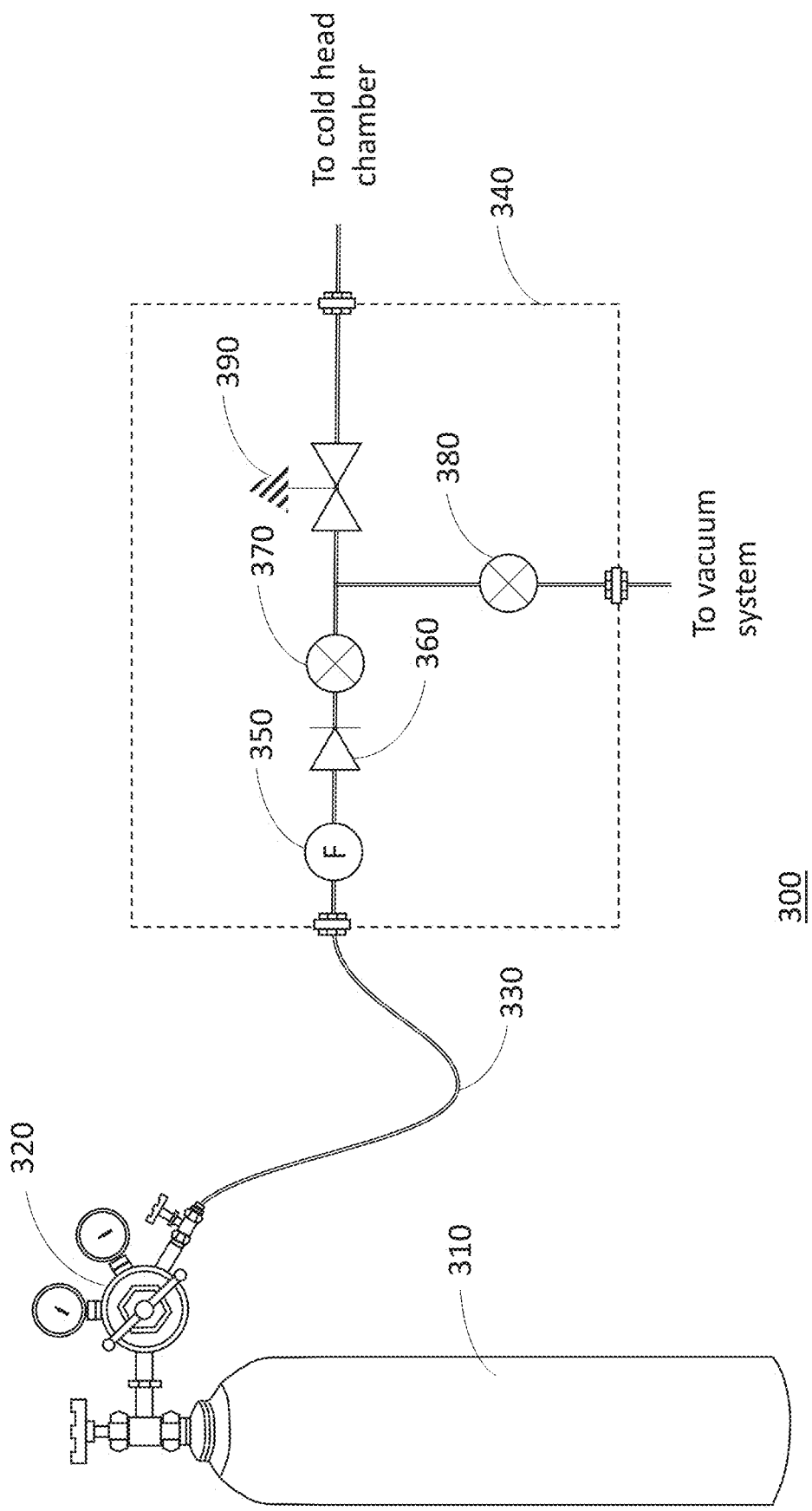
FIG. 3 is a schematic diagram of a pressure maintenance system that may be used with the current disclosure.

Maintenance of a constant pressure in cold head chamber 180 can be accomplished using a variety of approaches. An exemplary approach 300 is shown in FIG. 3 where a gas supply bottle 310 having a selected amount of gas stored at a selected pressure provides a source of gas for the system. Pressure in gas supply bottle 310 is typically chosen to be relatively high and a pressure regulator 320 is used to provide lower pressure gas to the system. This lower pressure is typically chosen to be above atmospheric pressure so that gas will flow out of gas supply bottle 310 and into the system. It should be noted that other embodiments of approach 300 could employ a pump, or other suitable apparatus to provide a suitable pressure. Gas from pressure regulator 320 passes through a gas delivery hose 330 that is connected to a manifold 340 which is comprised of a flow meter 350, a one way check valve 360, a supply service valve 370, a vacuum service valve 380, and a pressure relief valve 390. Manifold 340 is connected to cold head chamber 180. Thus, by closing of supply service valve 370 and opening vacuum service valve 380, it is possible to evacuate cold head chamber 180. Then, by closing vacuum service valve 380 and opening supply service valve 370, the gas pressure selected at pressure regulator 320 is maintained in cold head chamber 180. Preferably, the set point for pressure relief valve 390 is selected to be above the pressure selected at pressure regulator 320, and below the burst pressure of manifold 340 and cold head chamber 180. It should be noted that the details of the manifold presented here are exemplary and that other configurations may be apparent to those skilled in the art.

Figure 4:
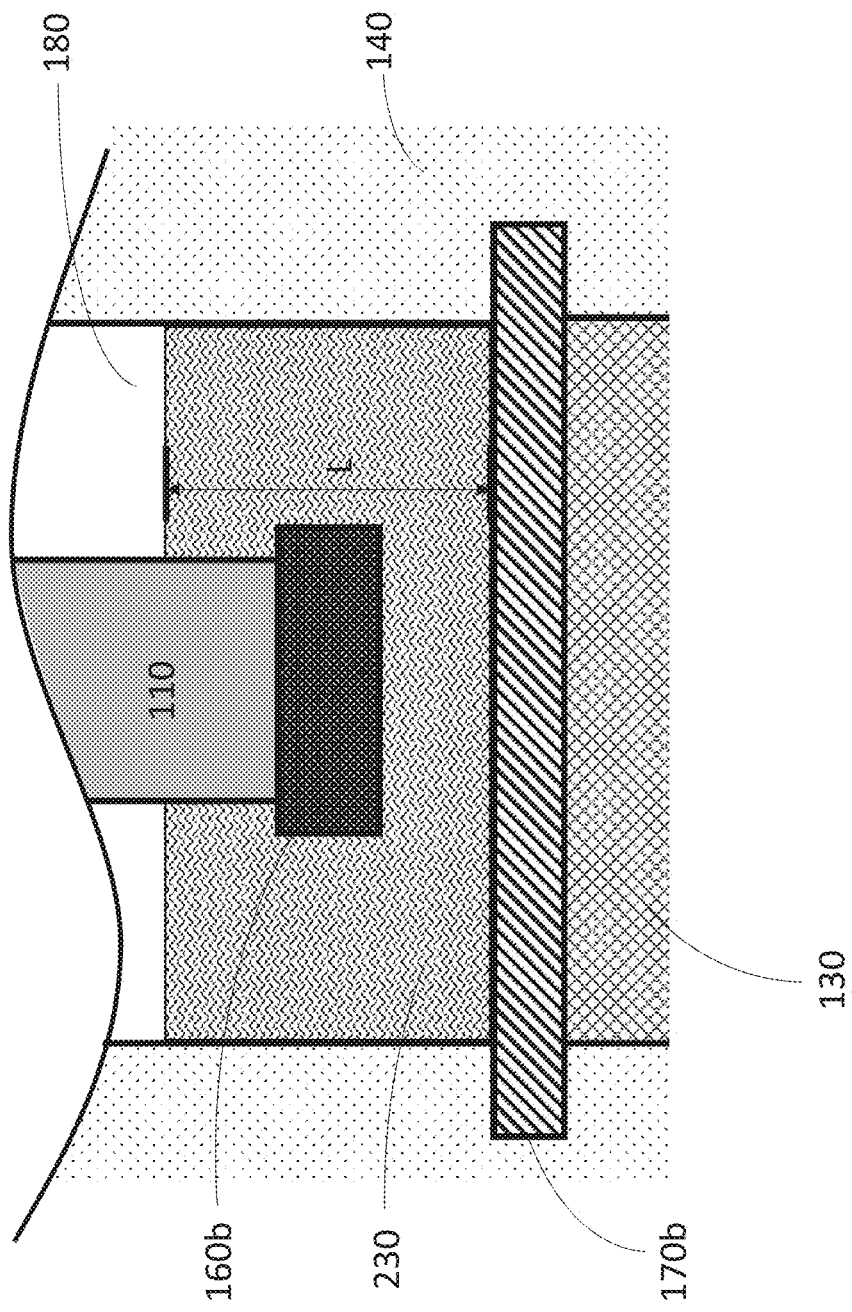
FIG. 4 is a close up representation of the cryogenic liquid that can collect around the cold head shown in FIG. 2b

FIG. 4 illustrates the consequence of operating a cold head 110 at a temperature below the boiling point of liquid helium when helium gas in cold head chamber 180 is held at a selected pressure. Helium gas is condensed by second stage 160b into liquid and liquid helium pool 230 grows until its surface reaches a distance, L, above the bottom of cold head chamber 180. When helium pool 230 reaches a depth of L, the system reaches a heat transfer equilibrium in which heat flux into cold head chamber 180 is balanced with the heat removed by cold head 110. It is noteworthy that the upper portions of cold head chamber 180 are typically warmer than lower portions by design, and L is limited to the depth at which cold head chamber 180 can be maintained at a temperature commensurate with the boiling point of liquid helium at the pressure present in cold head chamber 180. It is also noteworthy that because of boiling, convection, and diffusion, the temperature throughout helium pool 230 is substantially uniform. Thus, with pressure maintenance approach 300 it is possible to maintain helium in cold head chamber 180 at a pressure slightly above atmospheric pressure to prevent the ingress of air in the event of a leak, but it is not possible for the cold head to lower the temperature of the cold mass below 4.2 degrees Kelvin even if the cold head itself operates at a temperature substantially below 4.2 degrees Kelvin. It is also worth noting that the volume of liquid helium in cold head chamber 180 may pose a risk to the integrity of cold head chamber 180 during a quench since it has the potential to expand by a factor of approximately 757.

Figure 5:
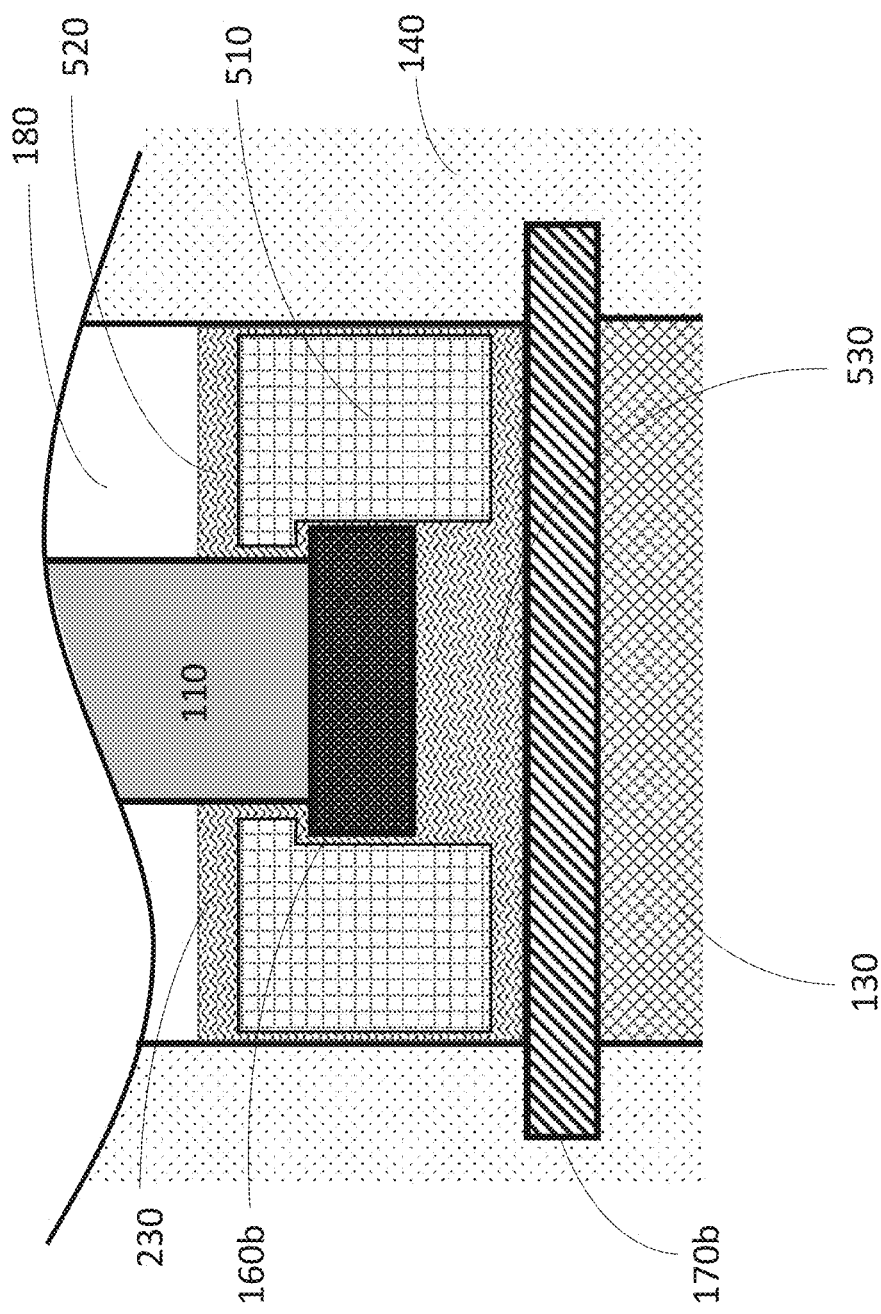
FIG. 5 is a schematic representation of the geometric extent of the thermal gradient enhancement structure of the current disclosure.

FIG. 5 shows a generic rendition of embodiments of the current disclosure. Here a thermal gradient magnifier 510 is placed in helium pool 230 and radially surrounding at least the second stage 160b of the cold head 110. Thermal gradient magnifier 510 is an object (typically an annular object or objects) having a shape and size that is chosen to reduce heat exchange in helium pool 230 caused by boiling, convection, and/or diffusion. By reducing heat exchange within helium pool 230, liquid helium in a surface zone 520 can have a different temperature than liquid helium in a bottom zone 530. Thus, liquid helium in surface zone 520 can be boiling at 4.2 degrees Kelvin, while liquid helium in bottom zone 530 has a temperature substantially lower than 4.2 degrees Kelvin. Since the liquid helium in bottom zone 530 is in direct contact with cold mass thermal link 170b, which in turn is in direct thermal contact with cold mass 130, it is possible to decrease the temperature of cold mass 130 below 4.2 degrees Kelvin provided that cold head 110 has sufficient cooling power to overcome the heat entering cold mass 130 through the cryostat. It should be noted that thermal gradient magnifier 510 provides for a connection between surface zone 520 and bottom zone 530 so that the zones are at substantially the same pressure. In general, thermal gradient magnifier 510 is constructed with one or more materials that have lower heat capacity and heat conductivity than both liquid helium and the materials used to construct cold head 110. These choices in material properties cause the body of thermal gradient magnifier 510 to be thermally insulating. Thermal insulation disposed between bottom zone 530 and surface zone 520 reduces heat transfer between the zones due to diffusion, but not necessarily due to convection. Multiple geometric designs intended to reduce convection within thermal gradient magnifier 510 are possible, and in general, designs with longer liquid helium paths between bottom zone 530 and surface zone 520 are preferable. It should also be noted that when the current disclosure is used in a superconducting magnet system, it is useful to include features in thermal gradient magnifier 150 that permit helium gas generated during flash boiling to escape in the event of a magnet quench. Several embodiments of thermal gradient magnifier 510 are shown in FIGS. 6 through 13.

Figure 6B:
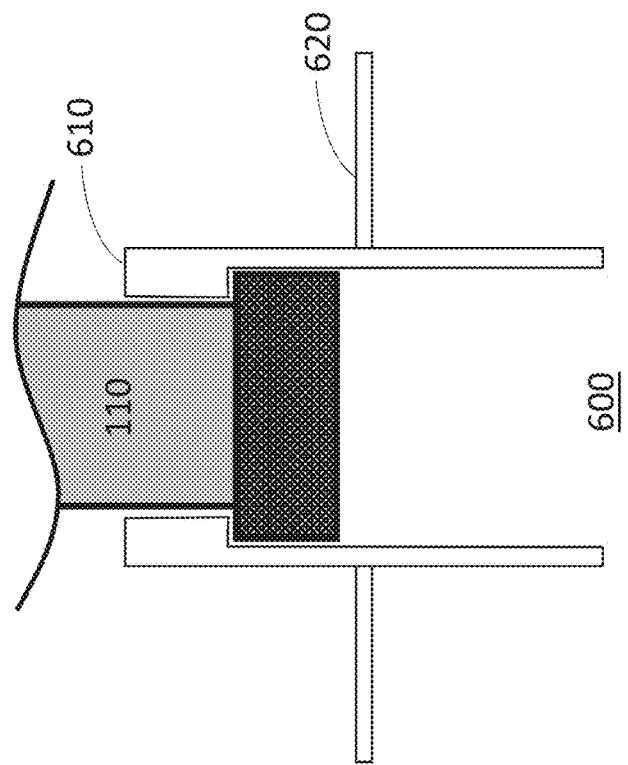
Figure 6A:
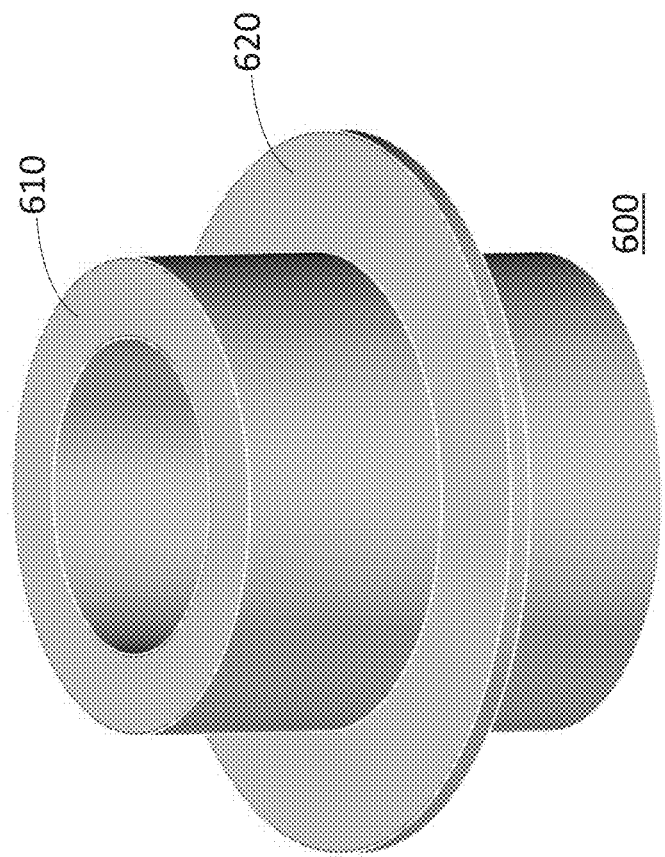
FIG. 6a is a perspective view representation of one embodiment of the thermal gradient enhancement structure employing a single vane.

FIGS. 6a and 6b show a single vane embodiment 600 of the thermal gradient magnifier 510. This embodiment is comprised of a cylindrical core 610 surrounding at least the second stage 160b of the cold head 110 and constructed of a material that has better thermal insulation properties at cryogenic temperatures than both liquid helium and the materials used in the construction of cold head 110. Suitable materials include plastics, some metals, and ceramics. Attached to cylindrical core 610 is a cryogen displacement structure in the form of single vane 620. Single vane 620 is a radial flange extending from the cylindrical core 610 and has a radial dimension that substantially fills the cross section of cold head chamber 180 and minimizes the flow of helium from bottom zone 530 and surface zone 520. As with cylindrical core 610, single vane 620 is preferably made of a material that is thermally insulating relative to liquid helium. Single vane 620 can be made to be rigid and it can have an axial thickness appropriate for the application. Alternatively, single vane 620 can be made to be thin and flexible so that in the event of flash boiling helium gas can easily escape from bottom zone 530.

Figure 7B:
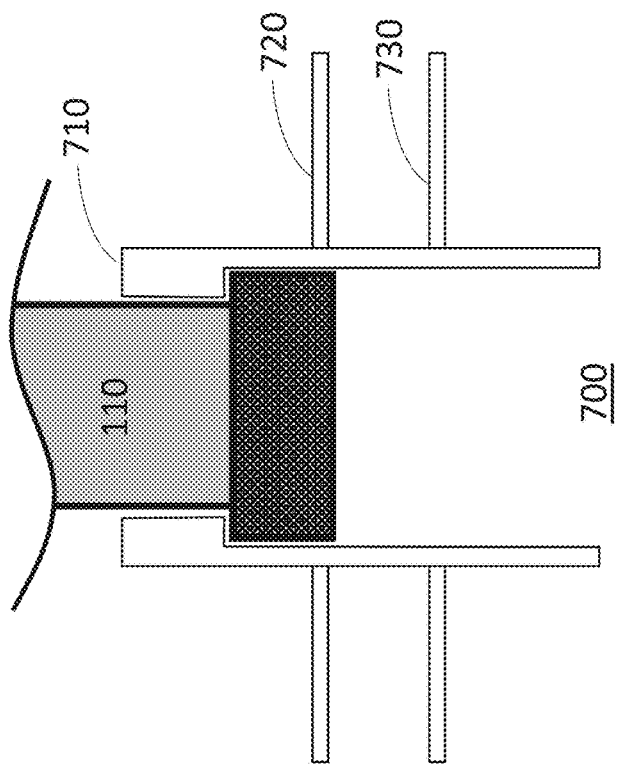
Figure 7A:
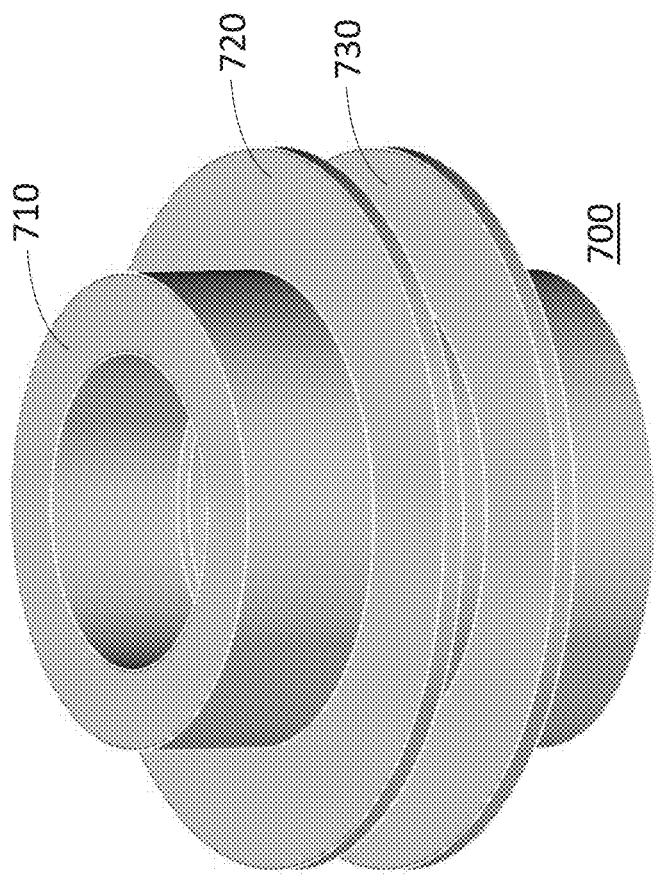
FIG. 7a is a perspective view representation of a second embodiment of the thermal gradient enhancement structure employing two vanes.

FIGS. 7a and 7b show a dual vane embodiment 700 of the thermal gradient magnifier 510. This embodiment is comprised of a cylindrical core 710 surrounding at least the second stage 160b of the cold head 110 and constructed of a material that has better thermal insulation properties at cryogenic temperatures than both liquid helium and the materials used in the construction of cold head 110. Attached to cylindrical core 710 is a cryogen displacement structure in the form of a first vane 720 and a second vane 730. First vane 720 and second vane 730 are radial flanges that extend from the cylindrical core 710 and have a radial dimension that substantially fills the cross section of cold head chamber 180 and minimizes the flow of helium from bottom zone 530 and surface zone 520. As with cylindrical core 710, first vane 720 and second vane 730 are preferably made of a material that is thermally insulating relative to liquid helium. First vane 720 and second vane 730 can be made to be rigid and they can have an axial thickness appropriate for the application. Alternatively, first vane 720 and second vane 730 can be made to be thin and flexible so that in the event of flash boiling helium gas can easily escape from bottom zone 530.

Figure 8B:
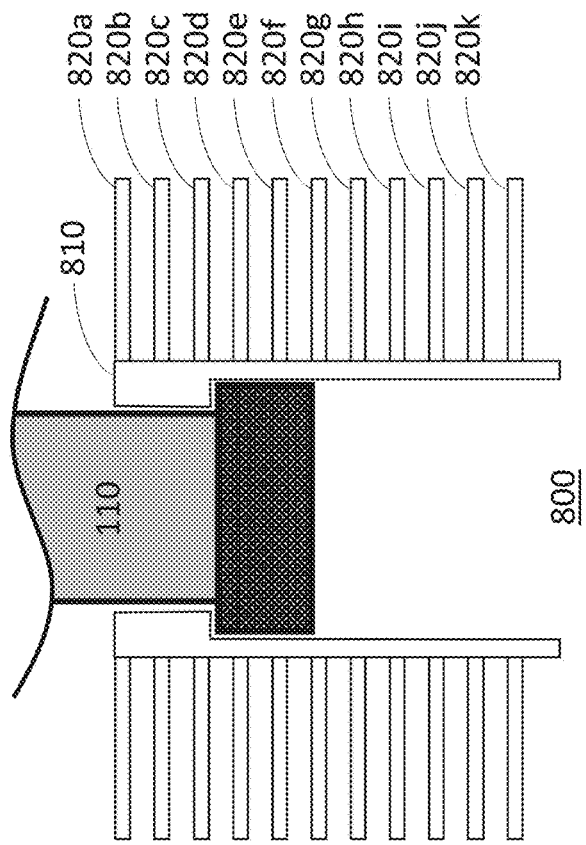
Figure 8A:
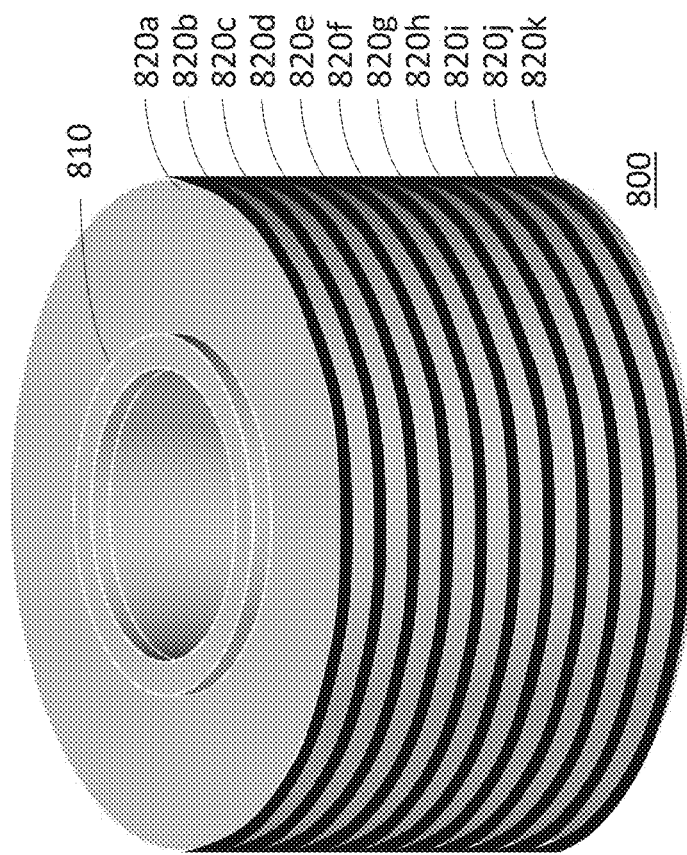
FIG. 8a is a perspective view representation of a third embodiment of the thermal gradient enhancement structure employing a plurality of vanes.

FIGS. 8a and 8b show a multi-vane embodiment 800 of the thermal gradient magnifier 510. As with previous embodiments this embodiment is comprised of a cylindrical core 810 surrounding at least the second stage 160b of the cold head 110 and constructed of a material that has better thermal insulation properties at cryogenic temperatures than both liquid helium and the materials used in the construction of cold head 110. Attached to cylindrical core 810 is a cryogen displacement structure in the form of a plurality of vanes 820a-820k (i.e., radial flanges) extending from the cylindrical core 810. It should be noted that the number of vanes may be determined by various design constraints and that the spirit of the invention does not limit the number of vanes to that shown in the figure. One or more of the plurality of vanes 820a-820k can be made to be rigid and they can have an axial thickness appropriate for the application. Alternatively, one or more of the vanes can be made to be thin and flexible so that in the event of flash boiling helium gas can easily escape from bottom zone 530.

Figure 9B:
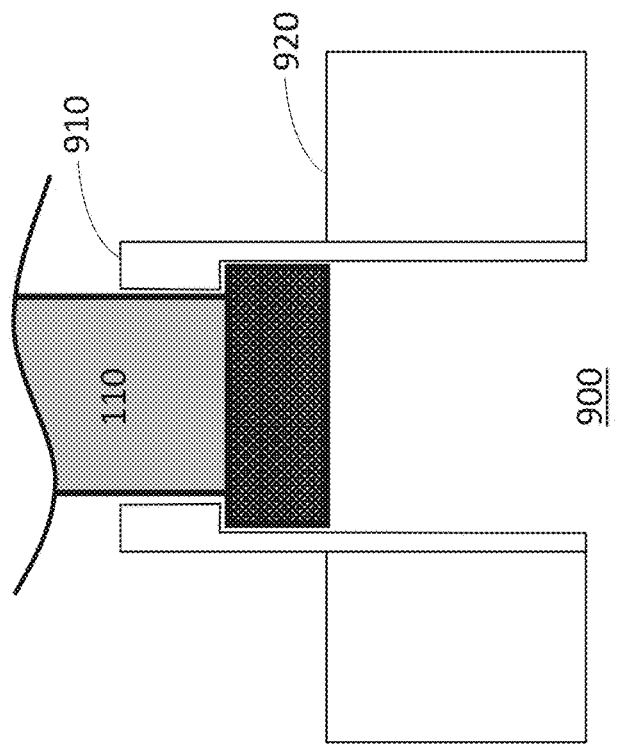
Figure 9A:
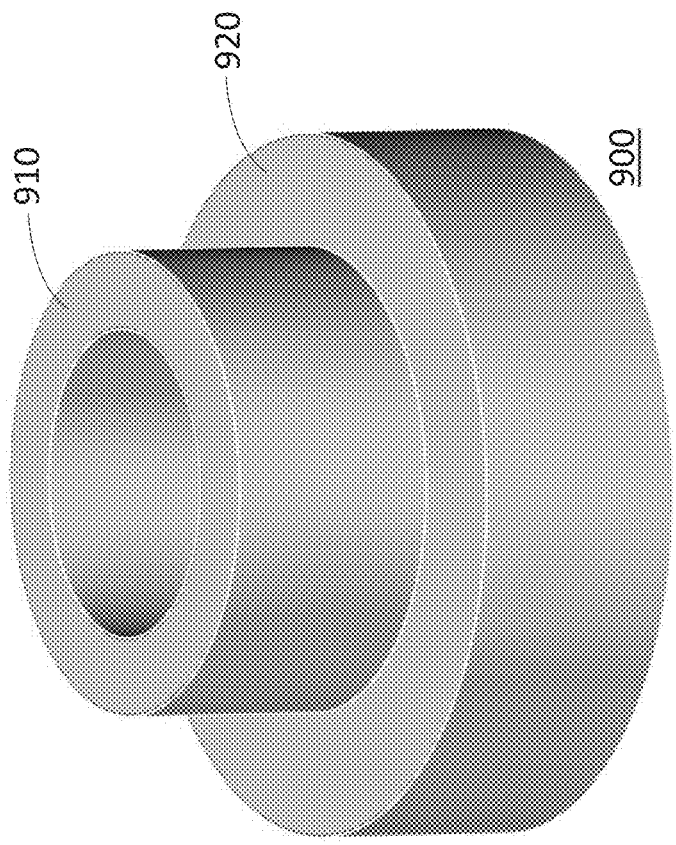
FIG. 9a is a perspective view representation of a fourth embodiment of the thermal gradient enhancement structure employing a solid cylinder to displace cryogenic liquid.

FIGS. 9a and 9b show a solid block embodiment 900 of the thermal gradient magnifier 510. As with previous embodiments this embodiment is comprised of a cylindrical core 910 surrounding at least the second stage 160b of the cold head 110 and constructed of a thermal insulating material. Attached to and extending from the cylindrical core 910 is a cryogen displacement structure in the form of an annular block 920. If desired a single annular block 920 can be extended to be in substantial contact with cold mass thermal link 170b while allowing liquid helium to collect in bottom zone 530. One relative benefit of this embodiment is that the amount of liquid helium allowed to collect in cold head chamber 180 is minimized while allowing heat to flow between cold mass thermal link 170b and second stage 160b.

Figures 10A, 10B:
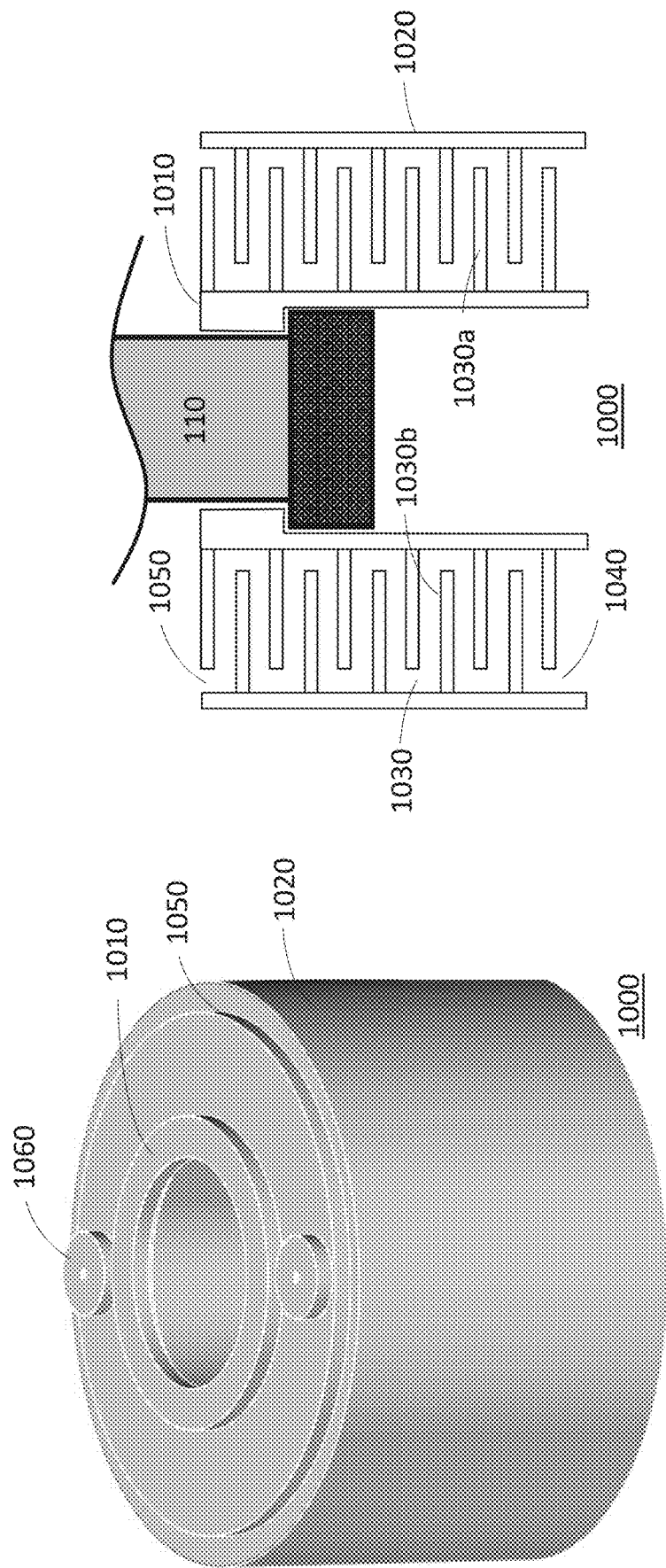

FIGS. 10a and 10b show a serpentine embodiment 1000 of the thermal gradient magnifier 510. As with previous embodiments this embodiment is comprised of a cylindrical core 1010 surrounding at least the second stage 160b of the cold head 110 and constructed of a thermal insulating material. Attached to cylindrical core 1010 is cryogen displacement structure in the form of an outer serpentine channel housing 1020 that substantially encapsulates a serpentine channel 1030 with a lower opening 1040 and an upper opening 1050. The serpentine channel 1030 is formed by a plurality of radial flanges 1030a extending radially outwardly from the cylindrical core 1010 and another plurality of radial flanges 1030b extending radially inwardly from the outer channel housing 1020, where the radial flanges 1030a and 1030b are axially interposed with each other (or meshed with each other) to form the serpentine channel therebetween. It should be noted that in this illustrative embodiment the inner and outer elements of serpentine channel housing 1020 are physically connected to maintain structurally integrity by one or more posts 1060 that extend through the structure. It is also worth noting that serpentine channel 1030 can be formed with any number of flanges 1030a/1030b within serpentine channel housing 1020. One relative benefit of this embodiment is that the distance that liquid helium must travel to move from the bottom of cold head chamber 180 and the top of thermal gradient magnifier 510 is relatively long, thus reducing the potential for convection, while simultaneously allowing a sufficiently open channel to permit gas to escape in a flash boiling event.

Figures 11A, 11B:
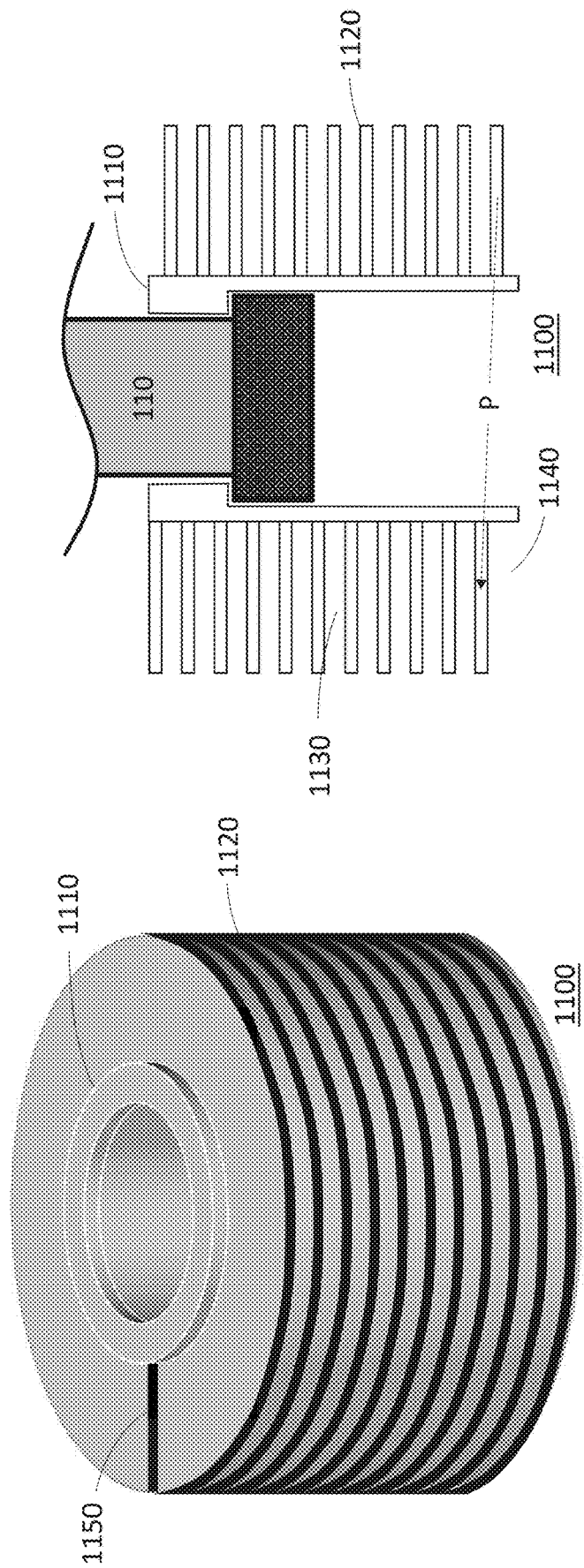

FIGS. 11a and 11b show a helical embodiment 1100 of the thermal gradient magnifier 510. As with previous embodiments this embodiment is comprised of a cylindrical core 1110 surrounding at least the second stage 160b of the cold head 110 and constructed of a thermal insulating material. Attached to cylindrical core 1110 is a cryogen displacement structure in the form of a helical vane 1120 that creates a helical channel 1130 with a pitch, P, a lower opening 1140 and an upper opening 1150. It should be noted that in this illustrative embodiment helical channel 1130 is in direct contact with the wall of cold head chamber 180. In alternate embodiments a thermally insulating wall between helical channel 1130 and the wall of cold head chamber 180 can be employed. It is worth noting that helical channel 1130 can be formed with any number of turns of helical vane 1120. One relative benefit of this embodiment is that the distance that liquid helium must travel to move from the bottom of cold head chamber 180 and the top of thermal gradient magnifier 510 is relatively long, thus reducing the potential for convection, while simultaneously allowing a sufficiently open channel to permit gas to escape in a flash boiling event.

Figure 12B:
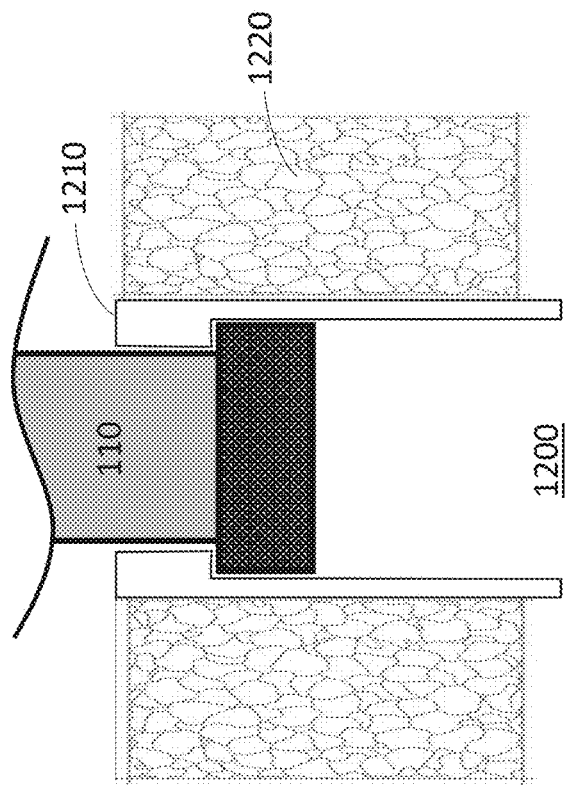
Figure 12A:
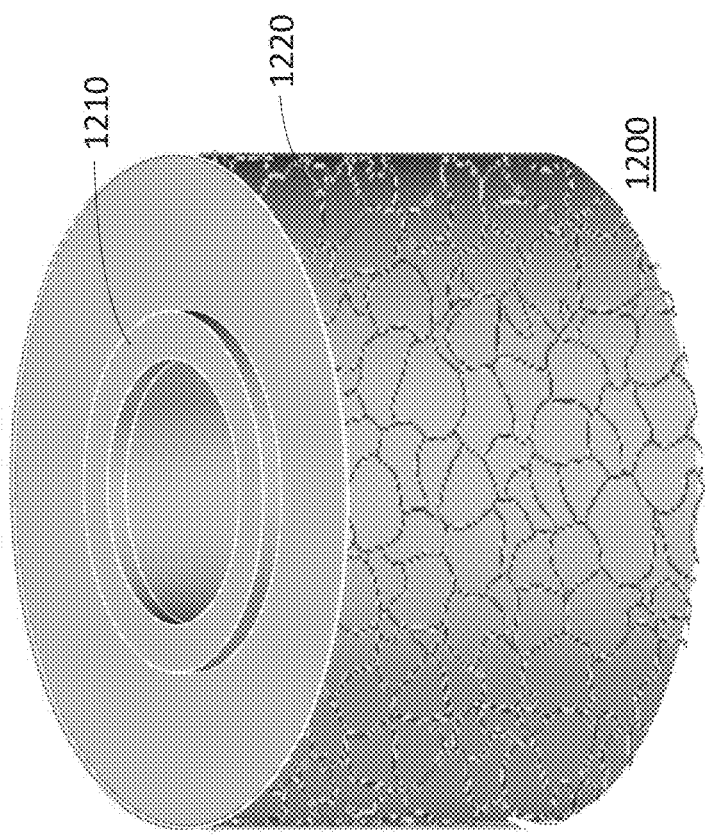
FIG. 12a is a perspective view representation of a seventh embodiment of the thermal gradient enhancement structure employing an amorphous open-cell space filling structure for the cryogenic liquid.

FIGS. 12a and 12b show a random cell embodiment 1200 of the thermal gradient magnifier 510. As with previous embodiments this embodiment is comprised of a cylindrical core 1210 surrounding at least the second stage 160b of the cold head 110 and constructed of a thermal insulating material. Attached to cylindrical core 1210 is a cryogen displacement structure in the form of an open cell space filling structure 1220 that creates random channels through which cryogenic liquid can move. It should be noted that in this illustrative embodiment these random channels are in direct contact with the wall of cold head chamber 180. In alternate embodiments a thermally insulating wall between the random channels and the wall of cold head chamber 180 can be employed.

Figures 13A, 13B:
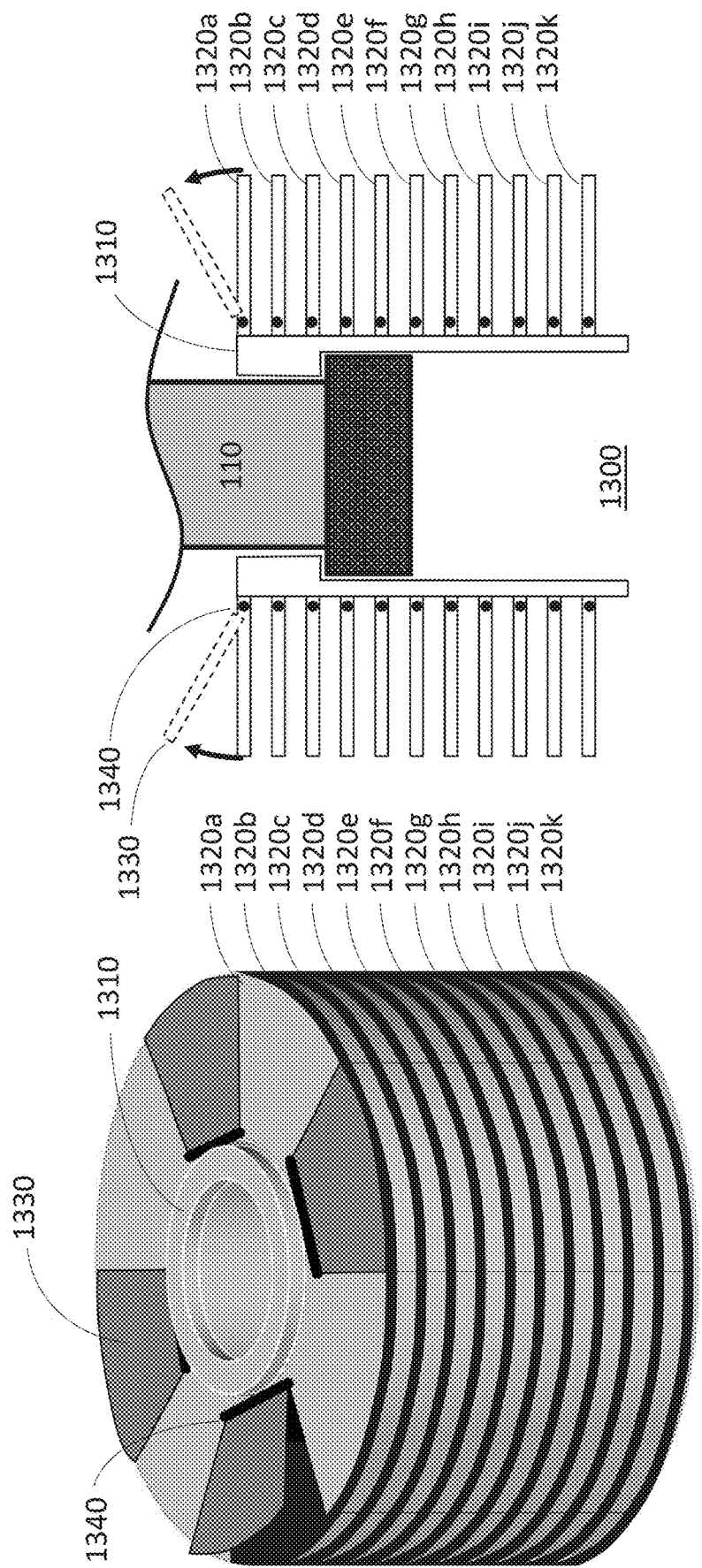

FIGS. 13a and 13b show a multi-vane embodiment 1300 of the thermal gradient magnifier 510. As with previous embodiments this embodiment is comprised of a cylindrical core 1310 surrounding at least the second stage 160b of the cold head 110 and constructed of a material that has better thermal insulation properties at cryogenic temperatures than both liquid helium and the materials used in the construction of cold head 110. Attached to cylindrical core 1310 is a cryogen displacement structure in the form of a plurality of vanes 1320a-1320k in a fashion similar to the embodiment shown in FIG. 8. However, in the present embodiment each vane has at least one moveable surface 1330 that can move in response to gas below it. In the present embodiment movable surface 1330 is attached to the vane with a hinge mechanism 1340. In alternate embodiments movable surface 1330 can be free-floating but constrained in its range of motion by a suitable restraint. In the event of flash boiling, movable surface 1330 elevates and allow gas to exit the structure. It should be noted that the number of vanes and the number of movable surfaces may be determined by various design constraints and that the spirit of the invention does not limit the number of vanes or movable surfaces to that shown in the figure.

With respect to embodiments of 600, 700, 800, 1000, 1100, and 1300 it is envisioned in certain embodiments that the axial thickness of the vanes 620, 720, 730, 820a-k, 1030a-b, 1120, and 1320a-k may be about 0.3 mm to about 5 mm thick, although other thicknesses may be used to fall within the scope of the current disclosure. In the embodiment of 900 it is envisioned that the axial thickness of the radial block 920 would be the distance from the bottom of the cryochamber to the bottom of the second stage 160b of the cryocooler. This axial thickness may be 10-20 cm, although other thickness may be used to fall within the scope of the current disclosure. With respect to the radial extent of vanes/blocks 620, 720, 730, 820a-k, 920 and 1320a-k, in certain embodiments it is desired that the radial gap between the vanes and the chamber wall be minimal but not necessarily liquid tight. It is desired in such embodiments that liquid helium be able to fill the chamber as needed. Also, the shape of the chamber may have irregularities (e.g., weld seams in the wall). For example, in some embodiments that radial spacing between the vanes/blocks 620, 720, 730, 820*a-k*, 920 and 1320*a-k* and the chamber wall may be between 0 mm and 2 mm.

While the foregoing description includes many details and specificities, it is to be understood that these have been included for purposes of explanation only, and are not to be interpreted as limitations of the current disclosure. It will be apparent to those skilled in the art that other modifications to the embodiments described above can be made without departing from the spirit and scope of the invention. For example (and without limitation), while the cores 610-1310 are described herein as "cylindrical" it will be apparent that similar or alternate shapes (such as hexagonal and the like) may be provided as appropriate or desired to surround at least a portion of the cold head 110. Accordingly, such modifications are considered within the scope of the invention as intended to be encompassed by the following claims and their legal equivalents.

What is claimed is:

1. A thermal gradient enhancement system for use with liquid cryogens contained in cryogenic systems employing a cold head deployed in a cold head chamber, said system comprising:
    a cold head chamber containing cryogens, the cold head chamber including a cold mass thermal link connected to a cold mass to facilitate heat transfer from the cold mass into the cold head chamber;
    a cold head deployed in the cold head chamber above the cold mass thermal link; and
    a core disposed around at least a portion of a cold head; and
    a cryogen displacement structure extending radially from said core into said cold head chamber and at least partially separating the cryogens below the cryogenic displacement structure from the cryogens above the cryogenic displacement structure to reduce heat exchange between the cryogens below the cryogenic displacement structure and the cryogens above the cryogenic displacement structure.

2. The system of claim 1, wherein the cryogens are liquid cryogens and the core is constructed from material having a lower heat capacity at cryogenic temperatures than the liquid cryogens.

3. The system of claim 1, wherein the cryogens are liquid cryogens and the core is constructed from material having lower heat conductivity at cryogenic temperatures than the liquid cryogens.

4. The system of claim 1, wherein the cryogens are liquid cryogens and the cryogen displacement structure is constructed from material having a lower heat capacity at cryogenic temperatures than the liquid cryogens.

5. The system of claim 1, wherein the cryogens are liquid cryogens and the cryogen displacement structure is constructed from material having lower heat conductivity at cryogenic temperatures than the liquid cryogens.

6. The system of claim 1, wherein:
    the pressure within the cold head chamber is maintained at a selected pressure by a pressure maintenance system.

7. The system of claim 6, wherein:
    the pressure maintenance system maintains pressure in the cold head chamber to a pressure at or above atmospheric pressure.

8. The system of claim 6, wherein:
    the pressure maintenance system maintains pressure in the cold head chamber to a pressure equal to atmospheric pressure.

9. The system of claim 6, wherein:
    the pressure maintenance system maintains pressure in the cold head chamber to a pressure above atmospheric pressure.

10. The device of claim 1, wherein the cryogen displacement structure is comprised of a single vane radially extending from the core.

11. The device of claim 1, wherein the cryogen displacement structure is comprised of a plurality of vanes that radially extend from the core.

12. The device of claim 1, wherein the cryogen displacement structure contains a serpentine channel connecting the lower and upper sections of said cryogen displacement structure radially outside of said core.

13. The device of claim 1, wherein the cryogen displacement structure contains a helical channel connecting the lower and upper sections of said cryogen displacement structure radially outside of said core.

14. The device of claim 1, wherein the cryogen displacement structure contains an amorphous open cell structure connecting the lower and upper sections of said cryogen displacement structure radially outside of said core.

15. The device of claim 1, wherein the cryogen displacement structure contains at least one movable section to permit the rapid exit of gas.

16. The device of claim 1, wherein the cryogen displacement structure contains at least one flexible section to permit the rapid exit of gas.

17. The system of claim 1, wherein the system is used in a superconducting magnet.

18. The system of claim 17, wherein the superconducting magnet is used in a magnetic resonance imaging magnet.

19. The system of claim 17, wherein the superconducting magnet is used in a particle accelerator.

20. The system of claim 17, wherein the superconducting magnet is used to control crystal growth.

21. A method for the formation of a thermal gradient in cryogens; wherein said cryogens are contained in a cold head chamber; and cooled by a cold head, the method comprising steps of:
    surrounding at least a portion of the cold head by a core and a cryogen displacement structure radially extending outward from said core, said cryogen displacement structure being physically configured to at least partially separate the cryogens from (a) a first side of the displacement structure approximate the cold head and (b) an opposite side of the displacement structure distal from the cold head.

22. The method of claim 21, wherein the cryogens include liquid cryogens and the core is constructed from material having a lower heat capacity at cryogenic temperatures than the liquid cryogens.

23. The method of claim 21, wherein the cryogens include liquid cryogens and the core is constructed from material having lower heat conductivity at cryogenic temperatures than the liquid cryogens.

24. The method of claim 21, wherein the cryogens include liquid cryogens and the cryogen displacement structure is constructed from material having a lower heat capacity at cryogenic temperatures than the liquid cryogens.

25. The method of claim 21, wherein the cryogens include liquid cryogens and the cryogen displacement structure is constructed from material having lower heat conductivity at cryogenic temperatures than the liquid cryogens.

26. The method of claim 21, further comprising maintaining the pressure within the cold head chamber at a selected pressure.

27. The method of claim 26, wherein the selected pressure is at or above atmospheric pressure.

28. The method of claim 26, wherein the selected pressure is equal to atmospheric pressure.

29. The method of claim 26, wherein the selected pressure is above atmospheric pressure.

30. The method of claim 21, wherein the cryogen displacement structure is comprised of a single vane that radially extends across a cross section of said cold head chamber outside of said core.

31. The method of claim 21, wherein the cryogen displacement structure is comprised of a plurality of vanes that radially extend across the cross section of said cold head chamber outside of said core.

32. The method of claim 21, wherein the cryogen displacement structure is comprised of a space filling shape, said shape at least partially filling the volume of said cold head chamber outside of said core while simultaneously permitting cryogens to be present below the cold head and above said cryogen displacement structure.

33. The method of claim 21, wherein the cryogen displacement structure contains a serpentine channel connecting the lower and upper sections of said cryogen displacement structure radially outside of said core.

34. The method of claim 21, wherein the cryogen displacement structure contains a helical channel connecting the lower and upper sections of said cryogen displacement structure radially outside of said core.

35. The method of claim 21, wherein the cryogen displacement structure contains an amorphous open cell structure connecting the lower and upper sections of said cryogen displacement structure radially outside of said core.

36. The method of claim 21, wherein the cryogen displacement structure contains at least one movable section to permit the rapid exit of gas.

37. The method of claim 21, wherein the cryogen displacement structure contains at least one flexible section to permit the rapid exit of gas.

38. The method of claim 21, further comprising maintaining the pressure within the cold head chamber at or above atmospheric pressure, and maintaining the temperature of the cryogens between the first side of the displacement structure and the cold head at a temperature below 4.2 degrees Kelvin.

39. A method for operating a cryogenic system, the system including cryogens contained in a cold head chamber and cooled by a cold head, the method comprising steps of:
   surrounding at least a portion of a cold head contained in a cold head chamber of a cryogenic system by a cryogen displacement structure radially extending outward from said cold head, said cryogen displacement structure at least partially separating cryogens contained in the cold head chamber between (a) a first side of the displacement structure approximate the cold head and (b) an opposite side of the displacement structure distal from the cold head;
   maintaining the pressure within the cold head chamber at or above atmospheric pressure; and
   maintaining a temperature of at least a portion of the cryogens contained in the cold head chamber between the first side of the displacement structure and the cold head at a temperature below 4.2 degrees Kelvin.

* * * * *